United States Patent

Ariyoshi

[11] Patent Number: 5,677,660
[45] Date of Patent: Oct. 14, 1997

[54] ELECTROMAGNETIC DEVICE

[75] Inventor: Akihiko Ariyoshi, Tokyo, Japan

[73] Assignee: Mitsubishi Denki Kabushiki Kaisha, Tokyo, Japan

[21] Appl. No.: 756,820

[22] Filed: Nov. 26, 1996

[30]  Foreign Application Priority Data

Jul. 10, 1996 [JP] Japan ................... 8-180794

[51] Int. Cl.$^6$ ................. G01V 3/00; G01R 33/20
[52] U.S. Cl. ........................... 335/301; 324/320
[58] Field of Search ........................ 335/216, 299, 335/301; 324/318–320

[56]  References Cited

U.S. PATENT DOCUMENTS

| | | | |
|---|---|---|---|
| 4,983,922 | 1/1991 | Tahara | 324/320 |
| 5,045,794 | 9/1991 | Dorri et al. | 324/320 |
| 5,418,462 | 5/1995 | Breneman et al. | 324/320 |

FOREIGN PATENT DOCUMENTS 5-23486  4/1993  Japan .................. H01F 7/20

OTHER PUBLICATIONS

"Magnet Field Profiling: Analysis and Correcting Coil Design," F. Romeo and D. I. Holt, Magnetic Resonance in Medicine 1, 44–45 (1984).

*Primary Examiner*—Cassandra C. Spyrou
*Assistant Examiner*—Raymond M. Barrera
*Attorney, Agent, or Firm*—Sughrue, Mion, Zinn, Macpeak and Seas

[57]  ABSTRACT

An electromagnetic device has a group of coils which are concentrically wound and used for generating a main magnetic field, and magnetic shims for correcting the uniformity of the main magnetic field in a uniform magnetic field region to be set in the vicinity of the central part of the group of coils. Part of the magnetic shims are arranged in a position where a particular high-order term in the uniform magnetic field becomes substantially zero when the correcting magnetic field generated by that part of the magnetic shims is expressed by a multinomial. The group of coils are arranged in such a manner that part of the high-order terms at the time the main magnetic field is expressed by the multinomial include a high-order magnetic term opposite in polarity to the high-order term of the correcting magnetic field whose order coincides with the order of that part of the high-order terms.

4 Claims, 3 Drawing Sheets

5,677,660

ELECTROMAGNETIC DEVICE

BACKGROUND OF THE INVENTION

The present invention relates to an electromagnetic device, particularly an electromagnetic device utilizing superconductivity, for use in, for example, a nuclear magnetic resonance tomograph (hereinafter called "MRI") which requires a uniform magnetic field.

A typical electromagnetic device for MRI normally has a group of coils that are concentrically wound to form a magnetic field region having desired uniformity in the central part of the region (hereinafter called the "uniform magnetic field region"). The Z-axis component $B_{CZ}$ of the magnetic field that the group of concentrically-wound coils form within the magnetic field region is expressed by the following equation:

$$B_{CZ} = B_0 + A_1 Z^1 + A_2 Z^2 + A_3 Z^3 + A_4 Z^4 + \ldots \quad (1)$$

where $B_o$ represents a magnetic field at an origin (0, 0, 0); and $A_n Z^n$, the next error magnetic field, whereby the error magnetic field of the relevant order is shown to be proportional to $Z^n$.

In the case of an electromagnetic device which generally requires greater magnetic field uniformity, a group of coils are arranged so that the error magnetic field is reduced by the coil-to-coil negation of the second and the following terms in Eq. (1).

More specifically, the coils are each set symmetrical to the origin so as to negate the odd-numbered terms in Eq. (1). Since the error term becomes smaller as the order becomes higher, moreover, the positions and ampere-turns of the group of coils in the electromagnetic device for MRI, for example, are determined so that the terms up to approximately 8th-order are canceled. A detailed description has been given of a method of designing a group of coils in, for example, "SUPER CONDUCTING MAGNET FOR MRI," John E. C. Williams, IEEE Transaction on Nuclear Science, Vol. NS-31, No. 4, August 1984.

However, machining errors and the magnetic field environment around the place of installation constitute a factor in causing error magnetic fields to electromagnetic devices. Therefore, a magnetic-field correcting device is necessitated to increase magnetic field uniformity within a uniform magnetic field region so as to negate such an error magnetic field. Magnetic-field correcting shim coils and magnetic shims have been used as magnetic-field correcting devices. Magnetic shims are often used in recent years in view of low manufacturing cost, facility in maintenance and so forth.

A detailed description has also been given of employing magnetic shims as magnetic-field correcting means in "Magnet Field Profiling: Analysis and Correcting Coil Design," F. Romeo and D. I. Holt, MAGNETIC RESONANCE IN MEDICINE 1, 44–55 (1984).

When a magnetic shim having a sectional area A is disposed along the main magnetic field (Z-axis) direction with a setting radius $\underline{a}$ and a setting angle at $\Phi$, a Z-direction component of the magnetic field formed at any given point P (r, θ, φ) within a uniform magnetic field region can be obtained from the following equation.

$$B_Z = -k \cdot (1/a) \cdot A \cdot \quad (2)$$

$$\sum_{n=0}^{\infty} \sum_{m=0}^{n} \epsilon m (n - m + 1)!/(n + m)! [P^m_{n+1}(\cos \alpha) \sin^{m+2} \alpha]_{\alpha 1}^{\alpha 2} \times$$

$$(r/a)^n \times P^m_{n+1}(\cos \theta) \times \cos m(\phi - \Phi)$$

wherein k: constant determined by the magnetic characteristics of the magnetic substance;

a: setting radius of the magnetic substance;

εm: Neumann coefficient: εm=1 when m=0 and εm=2 when m≠0;

$P^m_n$: Legendre function; and

α: setting angle of the magnetic substance.

Although the magnetic component formed by the magnetic shim consists of a limitless number of orders, $(r/a)^n$ in a magnetic component whose $\underline{n}$ is large, that is, a term whose order is high becomes small because a>r in general and the magnetic term can be ignored.

Since Eq. (2) is a polar coordinates representation, it corresponds to an orthogonal coordinate system for ordinary use as shown in Table 1.

TABLE 1

| n | m | component representation in orthogonal coordinate system |
|---|---|---|
| 1 | 0 | Z |
| 1 | 1 | X or Y |
| 2 | 0 | Z2 |
| 2 | 1 | ZX or ZY |
| 2 | 2 | X2–Y2 or XY |

When m=0 in Table 1, it corresponds to the Z term in Eq. (1).

In Eq. (1), $$f(\alpha) = P^m_{n+1}(\cos \alpha)(\sin \alpha)^{n+2} \quad (3)$$

When the position of the magnetic substance in the Z-axis direction at an angle α is normalized with the radius $\underline{a}$ in the setting position and placed as β, the angle α becomes $\alpha = \tan^{-1}(1/\beta)$ and from Eq. (3)

$$f(\beta) = P^m_{n+1}(\cos(\tan^{-1} 4/\beta))) \sin^{n+2}(\tan^{-1}(1/\beta)) \quad (4)$$

is obtained.

From Eq. (4), the relationship between the setting position of the magnetic shim in the uniform magnetic field region and the relevant magnetic component is obtained.

As shown in FIG. 1, the setting position of the magnetic shim is restricted to β<L/a given that the length of a coil accommodating vessel is set to 2L.

The magnetic component of the magnetic shim having a certain magnetic characteristic is determined by its setting position and sectional area as described above. When a magnetic shim is employed as a device for correcting magnetic field uniformity, iron is used because it is cheap and generally easy to procure. As electromagnetic devices for MRI, for example, are required to be small-sized, Strip-shaped and to offer an extremely uniform magnetic field region, the setting position of a magnetic shim is greatly restricted and limitations are imposed on the size and polarity of a magnetic component producible by the magnetic shim. Therefore, the number of magnetic shims for acquiring a magnetic field necessary for the correction of magnetic field uniformity tends to increase and the problem is that desired magnetic field correction becomes impossible on certain conditions.

SUMMARY OF THE INVENTION

An object of the present invention is to attain magnetic field correction with a small quantity of magnetic shims.

An electromagnetic device according to the present invention comprising a group of coils which are concentrically wound and used for generating a main magnetic field and magnetic shims for correcting the uniformity of the main magnetic field in a uniform magnetic field region to be set in the vicinity of the central part of the group of coils, wherein part of the magnetic shims are arranged in a position where a particular high-order term in the uniform magnetic field becomes substantially zero when the correcting magnetic field generated by that part of the magnetic shims is expressed by a multinomial and wherein the group of coils are arranged in such a manner that part of the high-order terms at the time the main magnetic field is expressed by the multinomial include a high-order magnetic term opposite in polarity to the high-order term of the correcting magnetic field whose order coincides with the order of that part of the high-order terms.

When the particular high-order term of the correcting magnetic field is a term of 4th-, 6th-, or 8th-order, the high-order magnetic term opposite in polarity to part of the high-order terms of the correcting magnetic field include terms of 2nd- and 8th-orders, those of 2nd- and 8th-orders, and those of 2nd- and 6th-orders.

DETAILED DESCRIPTION OF THE PREFERRED EMBODIMENTS (Embodiment 1)

A description will subsequently be given of an embodiment of the electromagnetic device of the invention by reference to the accompanying drawings.

Figure 1:
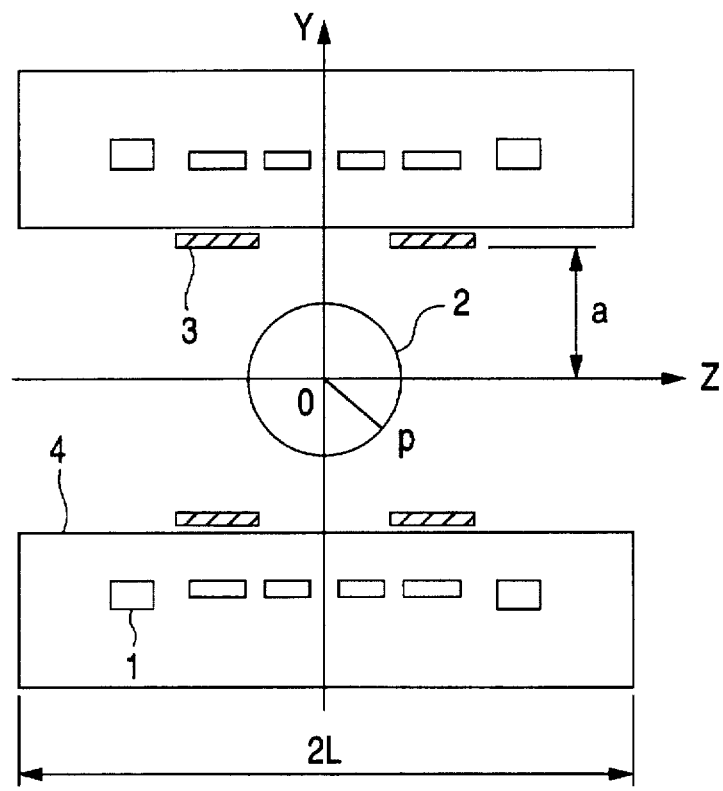
FIG. 1 is a sectional view of an electromagnetic device according to the present invention.

FIG. 1 is a sectional view of an electromagnetic device according to the present invention, wherein reference numeral 1 denotes a group of coils; 2, a uniform magnetic field region; 3, a magnetic shim; and 4, a vessel for accommodating the group of coils 1.

Figure 2:
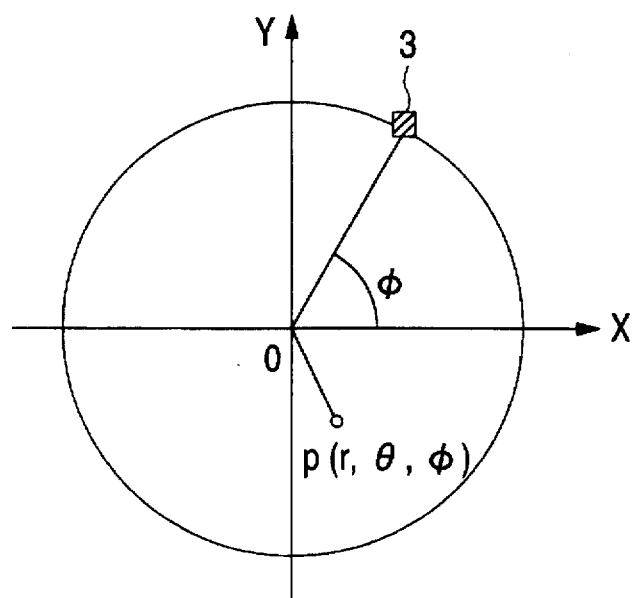
FIG. 2 is a diagram illustrating an exemplary arrangement of magnetic shims in the electromagnetic device according to the present invention.
Figure 3:
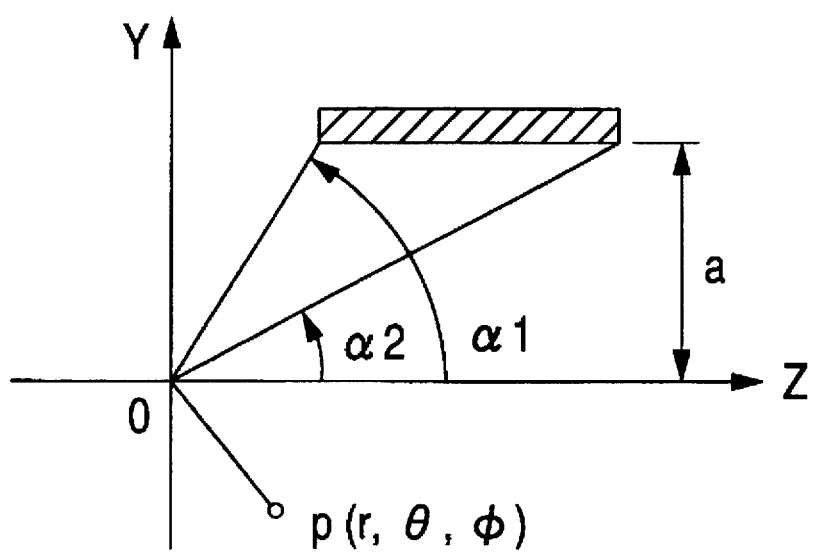
FIG. 3 is a diagram illustrating an exemplary arrangement of magnetic shims in the electromagnetic device according to the present invention.

FIGS. 2 and 3 are diagrams illustrating an exemplary arrangement of magnetic shims.

An electromagnetic device for MRI has an opening of approximately 1,000 mm in diameter and a length of approximately 2,000 mm and uses iron pieces approximately 10–200 mm long as magnetic shims. Actually, a combination of many iron pieces in the same shape is used to obtain a desired magnetic field by properly selecting the number and setting positions of them.

As stated above in reference to Eq. (2), a magnetic field resulting from the use of magnetic shims is determined by function $i(\beta)$ differences.

Figure 4:
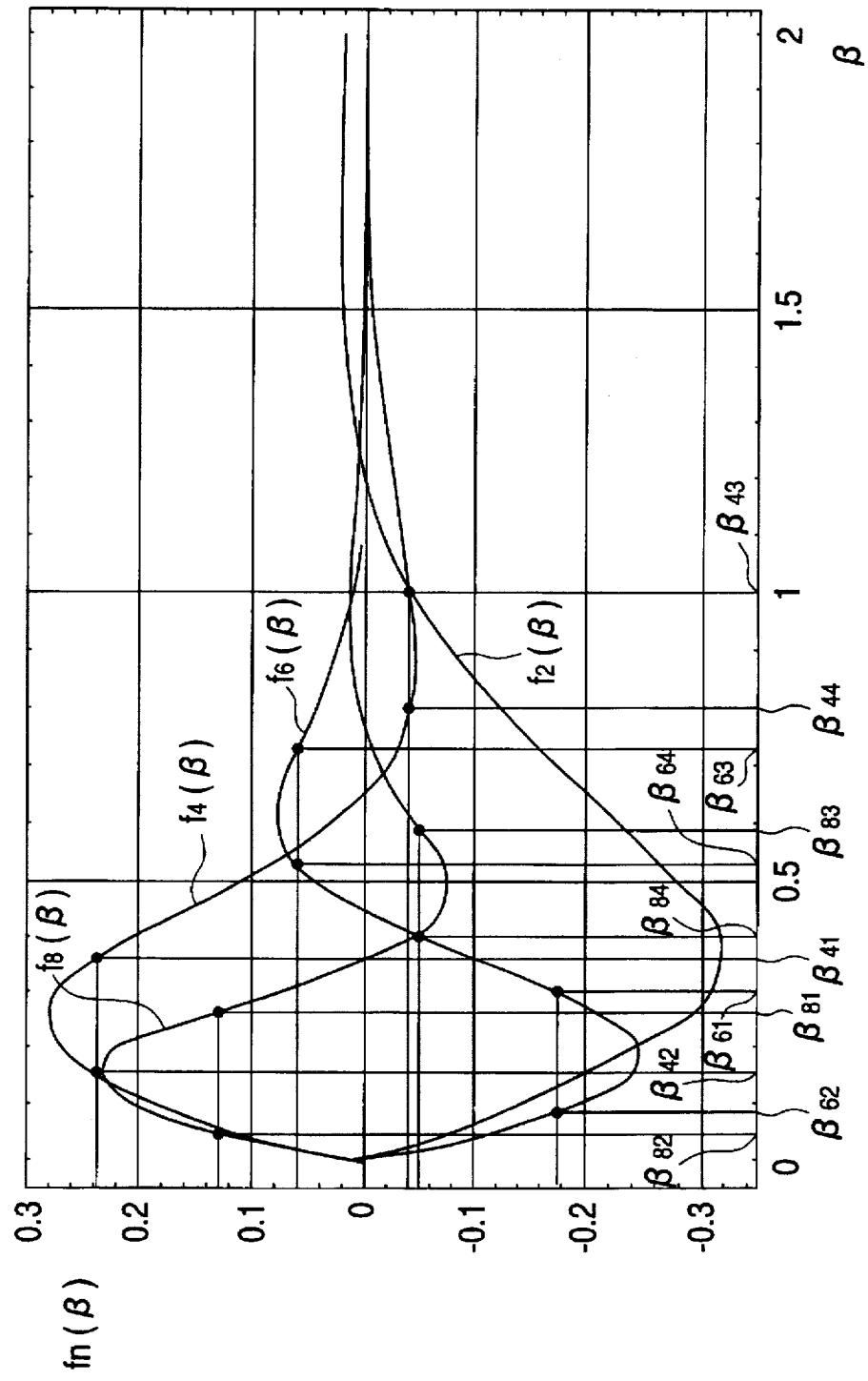
FIG. 4 is a graphic representation including curved lines obtained from functions $f(\beta)$ with respect to 2nd-, 4th-, 6th-, and 8th-orders for determining the setting positions of the magnetic shims in the electromagnetic device according to the present invention.

FIG. 4 is a graphic representation including curved lines obtained from the functions $f(\beta)$ of Eq. (4) with respect to 2nd-, 4th-, 6th-, and 8th-orders, and a series of two points of $\beta$ where the function $i(\beta)$ difference with respect to each of the 2nd-, 4th-, 6th-, and 8th-orders comes to 0. The term of order $\underline{n}$ of the function $f(\beta)$ will hereinafter be written as $fn(\beta)$.

As shown in FIG. 4, if the magnetic shim is set up within the range of $\beta_{41}$ to $\beta_{42}$, a magnetic field of 4th-order by means of the magnetic shim is seen to become zero because a $f_4(\beta)$ difference becomes zero. For the sake of convenience, the magnetic shim set up within the range of $\beta_{41}$ to $\beta_{42}$ will be called a magnetic shim 4. At this time, a magnetic field of any other order is as follows: 2nd-order, that is, a $f_2(\beta)$ difference represents synonymous polarity; 6th-order, that is, a $f_6(\beta)$ difference represents opposite polarity; and 8th-order, that is, a $f_8(\beta)$ difference represents synonymous polarity.

The position where the $f_4(\beta)$ difference becomes zero exists in not only the range of $\beta_{41}$ to $\beta_{42}$ but also the range of $\beta_{43}$ to $\beta_{44}$. The $f_2(\beta)$ difference then represents opposite polarity; the $f_6(\beta)$ difference represents synonymous polarity; and the $f_8(\beta)$ difference represents opposite polarity. In this case, a magnetic field of any other order becomes small in comparison with a case where the magnetic shim is set up within the range of $\beta_{41}$ to $\beta_{42}$, thus lowering the correction effect. Therefore, it is most effective to set up the magnetic shim within the range of $\beta_{41}$ to $\beta_{42}$.

It is possible to decrease the number of magnetic shims for use in magnetic field correction by using the group of coils to form an error magnetic field component opposite in polarity to the terms of 2nd-, 6th-, and 8th-orders by means of the magnetic shim 4.

An error magnetic field is generally corrected by the group of magnetic shims set up in several places inside an opening of electromagnetic device. Since the magnetic field of 4th-order by means of the magnetic shim 4 becomes zero, the magnetic field of 4th-order needs correction by means of the group of magnetic shims set up in any other position. As the group of magnetic shims generates magnetic fields other than that of 4th-order, these magnetic fields need negating. It is therefore only needed to determine the number of magnetic shims inclusive of a magnetic field of any order other than 4th.

From the same standpoint, the setting of a magnetic shim (called a magnetic shim 6 in this case) within the range of $\beta_{61}$ to $\beta_{62}$ makes the $f_6(\beta)$ difference zero and the magnetic field of 6th-order becomes zero. The magnetic field of any other order then represents opposite polarity with respect to 2nd-order, synonymous polarity with respect to 4th-order and opposite polarity with respect to 8th-order.

It is possible to decrease the number of magnetic shims for use in magnetic field correction by using the group of coils to form an error magnetic field component opposite in polarity to the terms of 2nd-, 6th-, and 8th-orders by means of the magnetic shim 6.

The setting of the magnetic shim within the range of $\beta_{63}$ to $\beta_{64}$ makes the $f_6(\beta)$ difference zero like $f_6(\beta)$. The magnetic field of any other order then represents opposite polarity with respect to 2nd-order, synonymous polarity with respect to 4th-order and opposite polarity with respect to 8th-order.

The setting of a magnetic shim (called a magnetic shim 8 in this case) within the range of $\beta_{81}$ to $\beta_{82}$ makes the $f_8(\beta)$ difference zero and the magnetic field of 8th-order becomes zero. The magnetic field of any other order then represents synonymous polarity with respect to 2nd-order, opposite polarity with respect to 4th-order and synonymous polarity with respect to 6th-order.

It is possible to decrease the number of magnetic shims for use in magnetic field correction by using the group of coils to form an error magnetic field component opposite in polarity to the terms of 2nd-, 4th-, and 6th-orders by means of the magnetic shim 8.

The setting of the magnetic shim within the range of $\beta_{83}$ to $\beta_{84}$ makes the $f_8(\beta)$ difference zero like $f_4(\beta)$. The magnetic field of any other order then represents opposite polarity with respect to 2nd-order, synonymous polarity with respect to 4th-order and opposite polarity with respect to 6th-order.

Although a description has been given of a case where the magnetic shims 4, 6 and 8 are each used independently, the magnetic shims 4, 6 and 8 may be used in combination. Needless to say, the length of the magnetic shim need not be limited to 0.2a but may be set as desired without departing from the scope of the present invention.

The electromagnetic device according to the present invention comprising a group of coils which are concentrically wound and used for generating a main magnetic field, and magnetic shims for correcting the uniformity of the main magnetic field in a uniform magnetic field region to be set in the vicinity of the central part of the group of coils, wherein part of the magnetic shims are arranged in a position where a particular high-order term in the uniform magnetic field becomes substantially zero when the correcting magnetic field generated by that part of the magnetic shims is expressed by a multinomial and wherein the group of coils are arranged in such a manner that part of the high-order terms at the time the main magnetic field is expressed by the multinomial include a high-order magnetic term opposite in polarity to the high-order term of the correcting magnetic field whose order coincides with the order of that part of the high-order terms. When the particular high-order term of the correcting magnetic field is otherwise a term of 4th-, 6th-, or 8th-order, the high-order magnetic term opposite in polarity to part of the high-order terms of the correcting magnetic field include terms of 2nd- and 8th-orders, those of 2nd- and 8th-orders, and those of 2nd- and 6th-orders. The number of magnetic shims for use in magnetic field correction can be decreased.

It is possible to apply the present invention to both an electromagnetic device utilizing normal conductivity and one utilizing superconductivity.

What is claimed is:

1. An electromagnetic device comprising:

a group of coils which are concentrically wound and used for generating a main magnetic field, and magnetic shims for correcting the uniformity of said main magnetic field in a uniform magnetic field region to be set in the vicinity of the central part of said group of coils, wherein part of said magnetic shims are arranged in a position where a particular high-order term in said uniform magnetic field becomes substantially zero when the correcting magnetic field generated by that part of said magnetic shims is expressed by a multinomial, and wherein said group of coils are arranged in such a manner that part of the high-order terms at the time said main magnetic field is expressed by the multinomial include a high-order magnetic term opposite in polarity to the high-order term of said correcting magnetic field whose order coincides with the order of that part of the high-order terms.

2. The electromagnetic device of claim 1, wherein the particular high-order term of said correcting magnetic field is a term of 4th-order, and wherein high-order magnetic terms opposite in polarity to part of high-order terms of said correcting magnetic field are a term of 2nd-order and a term of 8th-order.

3. The electromagnetic device of claim 1, wherein the particular high-order term of said correcting magnetic field is a term of 6th-order, and wherein high-order magnetic terms opposite in polarity to part of high-order terms of said correcting magnetic field are a term of 2nd-order and a term of 8th-order.

4. The electromagnetic device of claim 1, wherein the particular high-order term of said correcting magnetic field is a term of 8th-order, and wherein high-order magnetic terms opposite in polarity to part of high-order terms of said correcting magnetic field are a term of 2nd-order and a term of 6th-order.

* * * * *